(12) United States Patent
Hirler et al.

(10) Patent No.: US 7,973,359 B2
(45) Date of Patent: Jul. 5, 2011

(54) SEMICONDUCTOR DEVICE WITH A CHARGE CARRIER COMPENSATION STRUCTURE AND PROCESS

(75) Inventors: Franz Hirler, Isen (DE); Armin Willmeroth, Augsburg (DE); Anton Mauder, Kolbermoor (DE); Gerald Deboy, Klagenfurt (AT); Holger Kapels, Holzkirchen (DE); Carolin Tolksdorf, Steinhoering (DE); Frank Pfirsch, Munich (DE)

(73) Assignee: Infineon Technologies Austria AG, Villach (AT)

( * ) Notice: Subject to any disclaimer, the term of this patent is extended or adjusted under 35 U.S.C. 154(b) by 189 days.

(21) Appl. No.: 12/194,384

(22) Filed: Aug. 19, 2008

(65) Prior Publication Data

US 2010/0044788 A1 Feb. 25, 2010

(51) Int. Cl.
*H01L 29/66* (2006.01)

(52) U.S. Cl. .................. 257/335; 257/329; 257/E29.256
(58) Field of Classification Search .................. 257/329, 257/330, 332, 331, 335
See application file for complete search history.

(56) References Cited

U.S. PATENT DOCUMENTS

| | | | | |
|---|---|---|---|---|
| 6,747,315 | B1 * | 6/2004 | Sakamoto | 257/341 |
| 2001/0028083 | A1 * | 10/2001 | Onishi et al. | 257/328 |
| 2005/0012144 | A1 * | 1/2005 | Shirai et al. | 257/329 |

* cited by examiner

*Primary Examiner* — Phat X Cao
*Assistant Examiner* — Nga Doan
(74) *Attorney, Agent, or Firm* — Dicke, Billig & Czaja, PLLC

(57) ABSTRACT

A semiconductor device with a charge carrier compensation structure. In one embodiment, the semiconductor device has a central cell field with a gate and source structure. At least one bond contact area is electrically coupled to the gate structure or the source structure. A capacitance-increasing field plate is electrically coupled to at least one of the near-surface bond contact areas.

11 Claims, 5 Drawing Sheets

# SEMICONDUCTOR DEVICE WITH A CHARGE CARRIER COMPENSATION STRUCTURE AND PROCESS

BACKGROUND

The application relates to a semiconductor device with a charge carrier compensation structure in a semiconductor body and a process for the production of same.

Semiconductor devices are used as power transistors and due to the charge carrier compensation structure achieve a $R_{on}$ with significantly smaller chip areas than traditional power transistors. As a result their gate capacitances are considerably smaller, permitting them to be switched more quickly. However, they are at the same time more susceptible to vibrations and produce high voltage spikes due to their fast switching flanks. In such arrangements there is a fast drop in both gate-drain capacitance $C_{GD}$, also referred to as reverse transfer capacitance, and source-drain capacitance $C_{SD}$ as supply voltage $V_{DS}$ increases for certain applications. Extremely small capacitance values which exacerbate the disadvantages outlined above are reached even at moderate voltages $V_{DS}$.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, a semiconductor device with a central cell field and a near-surface gate-and source structure is provided. The cell field is surrounded by an edge region with at least one bond contact area which is electrically connected to a gate structure or a source structure. Positioned beneath at least one part of at least one of the bond contact areas is a laterally extending, capacitance-increasing field plate which is insulated from the semiconductor body and electrically connected to at least one of the near-surface bond contact areas.

Figure 1:
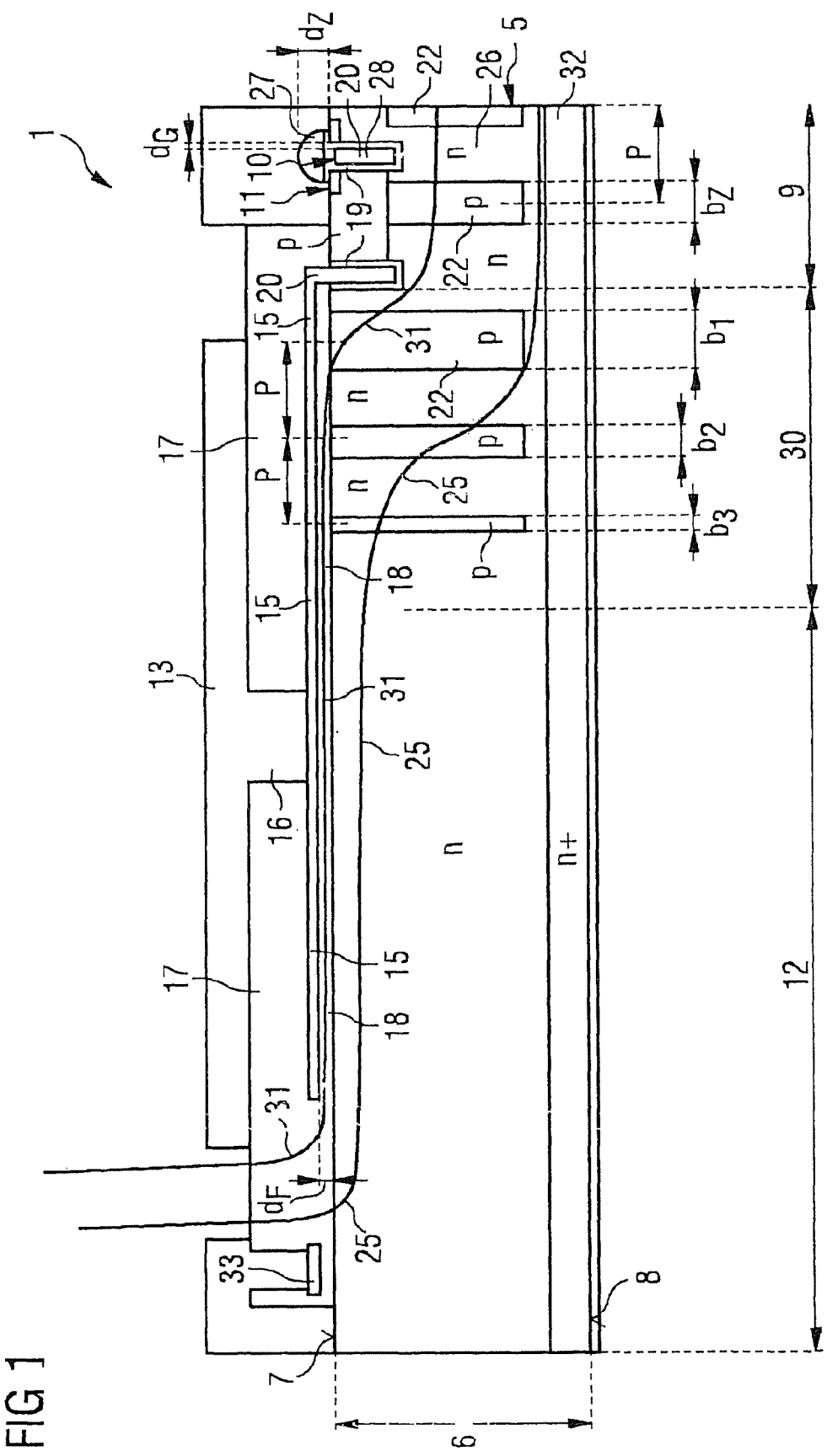
FIG. 1 illustrates a schematic cross-section through a semiconductor device as disclosed in one embodiment.

FIG. 1 illustrates a schematic cross-section through part of a semiconductor device 1 as disclosed in one embodiment. This part includes, on the right-hand side of FIG. 1, a last cell of a cell field 9 of the semiconductor device 1 and, towards the left-hand side of FIG. 1, an edge region extending to the edge 29 of a semiconductor chip of the semiconductor device 1. In the area of the cell field 9 the semiconductor device 1 has a charge carrier structure 5 in a semiconductor body 6, the semiconductor body 6 possessing an upper side 7 and a lower side 8. As illustrated in FIG. 1, a capacitance-increasing field plate 15 is connected to a near-edge trench gate electrode 20 of the cell field 9 and to a gate bond contact area 13.

Towards the upper side 7 of the semiconductor body 6, the charge carrier compensation structure 5 turns into a near-surface gate structure 10 and a source structure 11. The central cell field 9 is surrounded by an edge region 12 with at least one gate electrode area 13 which may also be designed as a gate bond contact area and which, in one embodiment, is electrically connected to the gate structure 10. Positioned between the gate bond contact area and the upper side 7 of the semiconductor body 6 are three layers: an intermediate insulating layer 17 which in one embodiment is positioned beneath the gate bond contact area 13; a laterally extending, capacitance-increasing field plate 15 which extends from the edge of the cell field 9 over the majority of the edge region and ends before a channel stopper electrode 33; and a field dielectric layer 18 positioned between a field plate 15 and the upper side 7 of the semiconductor body 6. The field dielectric layer 18 is thus positioned beneath the gate bond contact area 13. The field plate 15 is electrically connected to the gate potential via at least one contact via 16 through the field plate insulating layer 17. As illustrated in FIG. 1, the capacitance-increasing field plate 15 is thus connected both to a near-edge trench gate electrode 20 of the cell field 9 and to the gate bond contact area 13. Instead of the trench gate electrodes 20 illustrated in FIGS. 1 to 4 it is also possible to use planar gate electrodes.

With a field plate 15 of this type it is possible to expand the space charge zone laterally in the edge region and to reduce its penetration depth in the semiconductor body 6. This is illustrated by the equipotential lines 25 and 31 illustrated here by way of example. Equipotential line 25 illustrates approximately the maximum extent of the space charge zone in the cell field 9. When the maximum possible voltage is applied it extends over almost the entire drift zone 26 as far as the transition to the semiconductor substrate 32. In the edge region 12 the aim is to achieve the greatest possible capacitative effect by bringing the equipotential line 25 as close as possible to the upper side 7 of the semiconductor body 6 or even extending it as far as the field plate dielectric 18 at the maximum applicable blocking voltage at the semiconductor device 1.

In one embodiment of this arrangement, avoiding sharp radii of curvature of the equipotential lines and/or equipotential surfaces in the transition region 30 from the cell field 9 to the edge region 12, can be achieved by varying the compensation. To this end the degree of compensation, i.e., the difference between the p-and n-dopant dosages, is switched from an almost fully compensated state in the cell field 9 to a reduction in the p-dopant dosages towards the edge region 12. In one embodiment, this may be achieved by reducing the width b of the charge compensation zones 22, which are positioned approximately equidistant from one another in the cell field 9 with a predetermined stepwidth P and have a width $b_z$ in the cell field 9, from a width $b_1$—which corresponds approximately to width $b_z$—via $b_2$ to $b_3$. This prevents high peaks of electrical field strength forming at extreme curves in the equipotential lines 25/31 at the transition 30 from the cell field 9 to the edge region 12 and causing a premature avalanche break-through.

In one embodiment, therefore, a capacitance substantially independent of the voltage $V_{DS}$ is monolithically integrated in and on the semiconductor body 6 beneath the gate bond contact area 13 with the aid of the field plate 15 in such a manner that the voltage is reduced to almost zero over the field plate dielectric layer 18, which in one embodiment is made of a silicon oxide, resulting in a reduced space charge zone in the semiconductor body, rather than a large part of the space charge zone occurring in the semiconductor body 6 as was previously the case with charge compensation devices. A wide space charge zone is thus reduced no further than the size of the cell field 9, making it possible to achieve a high additional capacitance in the edge region 12. Due to the voltage requirement of high-blocking charge compensation devices the field plate oxide layer 18 must in addition be of a minimum thickness in order to prevent field breakdowns.

A gate oxide thickness $d_G$ is not therefore suitable for high blocking voltages and as a result in this embodiment, the field plate oxide layer 18 between the upper side 7 of the semiconductor body 6 and the field plate positioned on the field plate oxide layer 18, which is made of polycrystalline silicon, for example, is significantly thicker than the gate oxide 19. Alternatively, it is even possible to apply the intermediate insulating layer thickness $d_z$ of the central cell field 9 in the edge region 12 in order to position the capacitance-increasing field plate 15 in the edge region 12 and, for example, to make it of a metal. n-doping in the semiconductor body 6 in the edge region 12 of a few $10^{15}$ cm$^{-3}$, for example $4 \times 10^{15}$ cm$^{-3}$, and a field plate oxide layer thickness $d_F$ of up to a few micrometers, for example 2.3 μm, result in a space charge zone of approximately 2 μm in the edge region 12, and in a semiconductor body 6 made of silicon a gate-drain voltage $V_{GD}$ of 100 V drops by approximately 12 V.

If, for example, the gate bond contact area 13 has an edge length within a range of approximately 0.2 mm to approximately 1 mm, i.e., for example a surface area of 0.438×0.353 mm², it is possible with a transition region 30 of approximately 50 μm to raise the potential at all four edges 29 in the edge region 12 of the semiconductor body 6, and in each case to achieve an effective area for the additional capacitance with the aid of the capacitance-increasing field plate within a range of approximately 0.1 mm to approximately 0.94 mm, i.e., for example a surface area of 0.338×0.253 mm², giving an additional capacitance in the region of up to several picofarad, e.g., 1 pF picofarad, at a gate voltage of 100 V.

This semiconductor element 1 illustrated in FIG. 1 involves no additional production costs. It is possible to go on using mask processes as in the past. Moreover, it is not necessary to enlarge the chip area in order to create additional reverse transfer capacitance through the field plate 15 in the edge region 12. Furthermore, by coupling the field plate 15 to the gate bond contact area 13 by a contact via 16, the additional capacitance thus created is dependent on the drain source voltage $V_{DS}$ to only a slight extent and is therefore effective in a range in which reverse transfer capacitance $C_{GD}$ is small.

In order to make use of this it is simply necessary to create the transition region 30 from the column regions/charge compensation zones 22 with columns of the cell field 9 to the edge regions 12 as indicated in the structures illustrated in the following figures. To this end, as illustrated in FIG. 1, the compensation charge of the columns 20 is reduced bit by bit starting from cell field 9 until finally only one n-doped region remains in the edge region 12. In addition, the vertical distribution of the doping in the charge compensation columns 22 can be varied. It is also possible to reduce the p-column width b bit by bit, as illustrated in FIG. 1, from $b_1$ via $b_2$ to $b_3$. Similarly, where further areas are available in the edge region 12 on the upper side 7 of the semiconductor body 6, it is possible to provide further gate bond contact areas 13 in order to further increase reverse transfer capacitance.

Moreover, in one embodiment in order to increase the capacitance in the edge region 12 it is possible to further reduce the thickness of the field plate oxide layer 18, i.e., the thickness of an oxide between the polysilicon of the gate and the silicon surface 7 in the region of the gate bond contact area 13, particularly since in theory an oxide thickness of 0.6 μm is sufficient for a dielectric strength of 600 V. In order to meet critical reliability requirements, it is thus useful to provide a double oxide thickness of 1.2 μm.

It may be useful to select a thickness of field plate oxide layer 18 in the region of the field plate 15 different from that of the oxide layer outside the region of the field plate in order to optimise the oxide thickness in these regions in accordance with the requirements for a flange, for example. If the thickness outside the field plate 15 is approximately 2.4 μm, for example, and if it is reduced to 1.2 μm in the region of the field plate 15 in accordance with the consideration set out above, it is possible to increase reverse transfer capacitance in relation to the homogeneous, greater thickness. As a result, it would be possible—discounting the decrease in voltage in the semiconductor material—to increase the value of 1 pF cited above by a factor of 2, to 2 pF.

A process for the production of a semiconductor device 1 with a charge carrier structure 5 in a semiconductor body 6 including an upper side 7 and a lower side 8 can be carried out with the following processes. Following the completion of drift zones 26 and charge compensation zones 22 on a semiconductor body 6 which takes the form of a semiconductor wafer, and following the application of a gate oxide 19 in the cell field 9 a field plate oxide layer 18 thicker than the gate oxide 19 is applied in the edge region 12. An electrically conductive, capacitance-increasing field plate structure 15 is then applied to the field plate oxide layer 18. This can take place simultaneously with the application of gate electrode material 28 in the cell field 9.

It is then possible to apply an intermediate insulating layer 17 in the edge region 12 of the capacitance-increasing field plate structure 15 simultaneously with the application of an intermediate insulating layer 27 in the cell field 9 and with the opening of through-plated holes 16 to the field plate structure 15 in the intermediate insulating layer 17. Electrically conductive bond contact areas 13 are then applied in the edge region 12, forming a bond with the capacitance-increasing field plate structure 15. It is then possible to finish the semiconductor device 1 by, for example, dividing the semiconductor wafer into individual semiconductor chips and mounting it on a corresponding flat conductor frame. External contacts on the flat conductor frame are then connected via bond connections, for example, to the bond contact areas on the upper side 7 of the semiconductor chip. It is then possible to pour the semiconductor chip with the bond connections into a plastic package molding compound from which the external contacts project.

In one embodiment of the process the capacitance-increasing field plate 15 is positioned beneath a gate bond contact area 13 and set to gate potential by a contact via 16 through an intermediate insulating layer 17. Instead of positioning the field plate structure 15 beneath a gate bond contact area 13 it is also possible to position such a field plate structure 15 beneath a source bond contact area 14 as illustrated in one of the following figures. In such cases the source bond contact area is then set to source potential via contact vias 16 through an intermediate insulating layer 17. In one embodiment illustrated in FIG. 1, the capacitance-increasing field plate 15 is electrically connected to near-edge trench gate electrodes of the cell field 9 and to a gate bond contact area 13. This can be achieved by using the appropriate mask layouts.

In the embodiment illustrated in FIG. 1, charge compensation zones 22 provided with a width $b_1$, $b_2$ and $b_3$ which decreases toward the edge region 12 at a constant stepwidth P are applied towards the edge region of the semiconductor body 12. The advantages of a process of this type have already been described above and will not therefore be repeated here. In the transition region 30 towards the edge region 12, instead of a decreasing width b the charge compensation zones 22 may be provided with a decreasing depth t at a constant stepwidth P, as illustrated in one of the following figures.

The application of an electrically conductive, capacitance-increasing field plate structure 15 to the field plate oxide layer 18 can be carried out simultaneously with the application of gate electrode material 28 in the cell field 9 by using the depositing and structuring of a highly doped polysilicon. The application of an intermediate insulating layer 17 in the edge region 12 of the capacitance-increasing field plate structure 15 can also be carried out simultaneously with the application of an intermediate insulating layer 27 in the cell region 9 by using the depositing and structuring of silicon oxide or silicon nitride.

Through-plated holes 16 to the field plate structure 15 in the intermediate insulating layer 17 can be opened by using etching—in one embodiment dry etching or plasma etching. The application of electrically conductive bond contact areas 13 in the edge region 12, thereby forming a bond with the capacitance-increasing field plate structure 15, can also be carried out by using the depositing and structuring of a metal layer.

Figure 2:
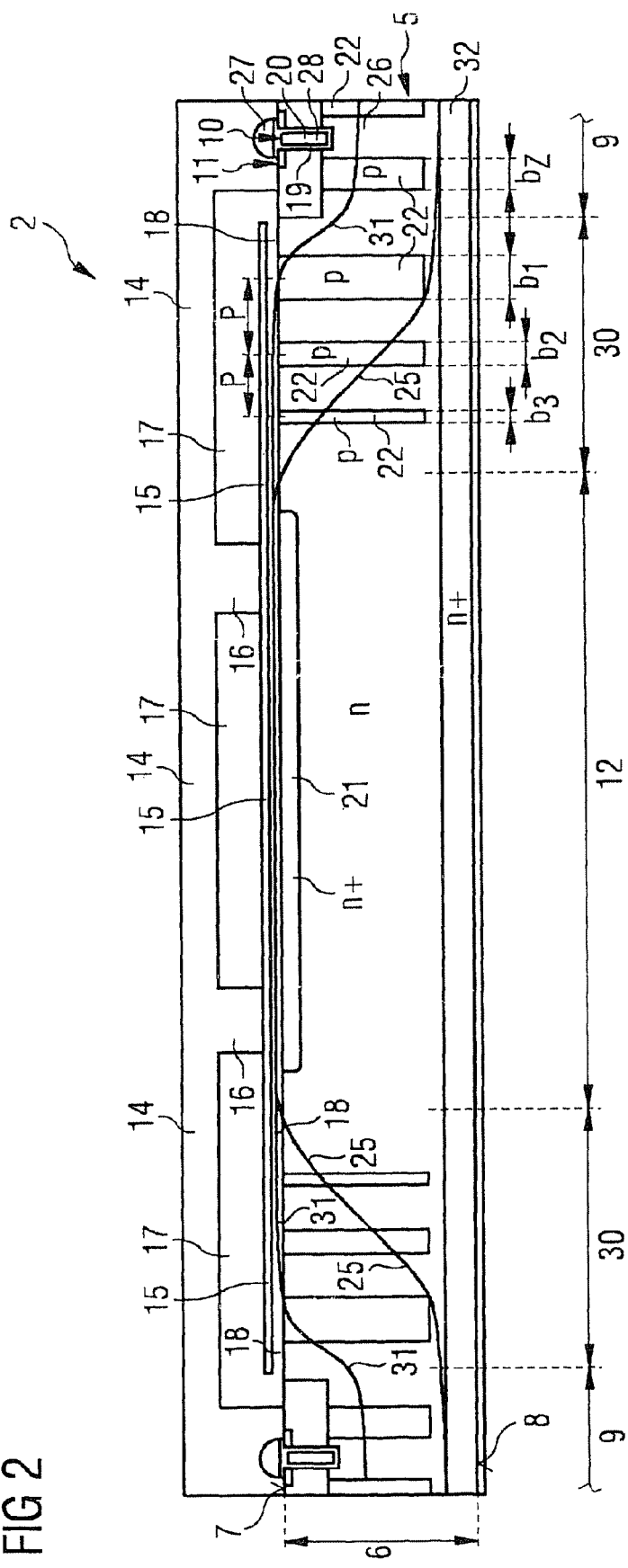
FIG. 2 illustrates a schematic cross-section through a semiconductor device as disclosed in a further embodiment.

FIG. 2 illustrates a schematic cross-section through a semiconductor device 2 as disclosed in a further embodiment. Components with functions identical to those illustrated in FIG. 1 are indicated by using the same reference numerals and are not described in greater detail here.

The edge region 12/12' need not necessarily coincide with the lateral edge termination of the semiconductor device to ensure the electrical blockability between the edge 29 illustrated in FIG. 1 and the active area of the semiconductor device. In other embodiments, the edge region 12/12' can also be a region inside the active area of the semiconductor device and/or between the active area of the semiconductor device and the lateral edge termination of the semiconductor device. The edge region 12' illustrated in FIG. 2 is characterised in that in the case of blocking the space charge zone extends considerably closer to the device surface than in the active area with the compensation zones, thus considerably increasing the vertical space charge capacity in the region of the edge regions 12'.

In one embodiment, a capacitance-increasing field plate structure 15 is provided in an edge region 12'. In the view illustrated in FIG. 2, the edge area 12' is positioned in the centre of the figure at a distance from an electrical edge termination, while parts of the central cell field 9 are illustrated on either side. Between them are once again transition regions 30 in which the equipotential lines 25 and 31 are drawn up towards the upper side 7 of the semiconductor body 6 with relatively moderate radii of curvature. In this arrangement an $n^+$-conducting, near-surface zone 21 ensures that both the potential line 25 at maximum field strength and the potential line 31 run in the field plate oxide layer 18 at all times, thereby making it possible to increase the capacitance again above that of the example illustrated in FIG. 1 at identical boundary and initial conditions by 25% to 1.25 pF if, as illustrated in FIG. 1, for example, the capacitance-increasing field plate structure 15 is positioned beneath a gate bond contact area in the edge region 12.

In one embodiment illustrated in FIG. 2, however, the field plate structure 15 is in contact not with a gate bond contact area, but with a source bond contact area 14. This metal source bond contact area 14 is electrically connected to the field plate 15 by contact vias 16. In this arrangement the field plate structure 15 extends to the upper side 7 of the semiconductor body 8 over both the transition regions 30 and the edge region 12. In the cell region 9 the source bond contact area 14 turns into the source electrode and the source structure 11.

In terms of the width of the charge compensation zones 22, the transition regions 30 in FIG. 2 are designed in exactly the same manner as the transition zone 30 in FIG. 1 and will not therefore be described again at this point. In the production process it is, however, important to note that prior to the application of the field oxide layer 18 in the edge region 12 a highly doped, $n^+$-conducting zone 21 is inserted into the upper side 7 of the semiconductor body 6 in the edge region 12 in order to achieve the advantages set out above, namely the shifting of the equipotential lines from the semiconductor body 6 to the insulator of the field plate oxide layer 18. With the structure illustrated in FIG. 2 it is possible to achieve an increase in source-drain capacitance $C_{SD}$ which is only slightly dependent on voltage.

Figure 3:
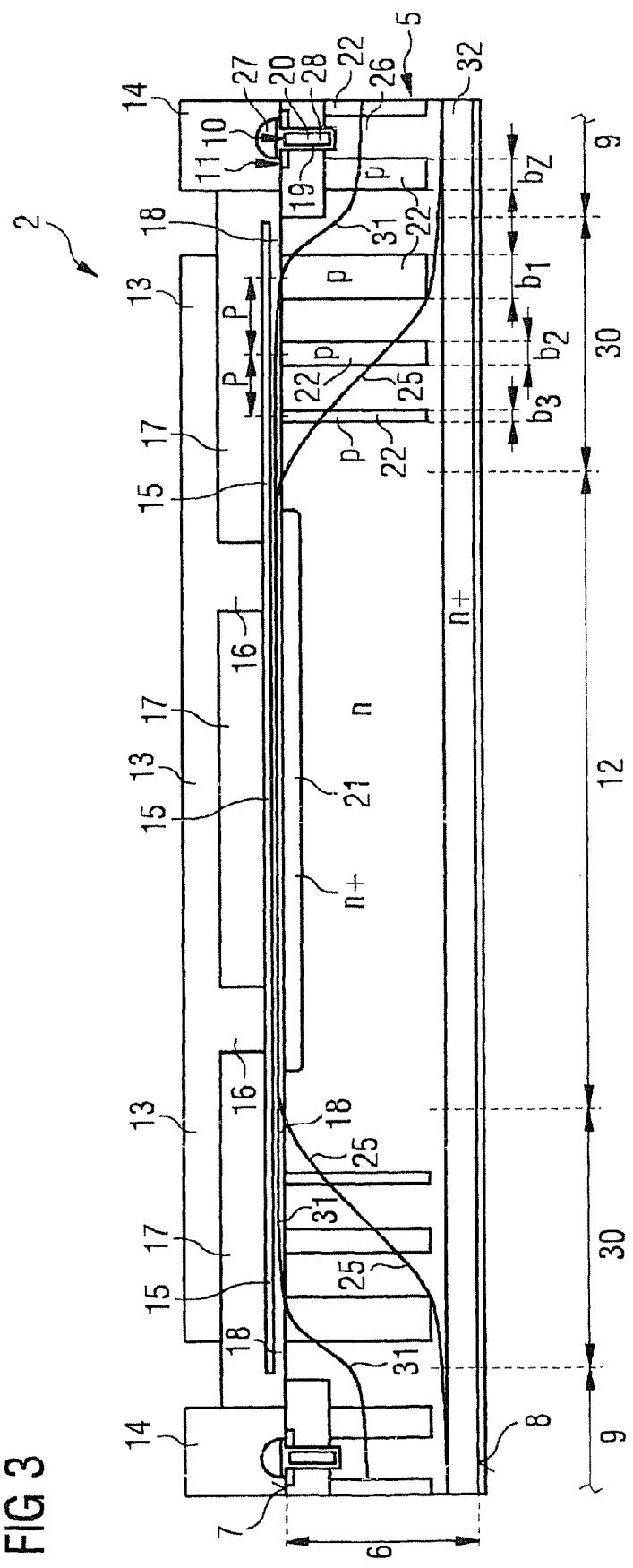
FIG. 3 illustrates a schematic cross-section through an alternative embodiment of the semiconductor device illustrated in FIG. 2.

FIG. 3 illustrates a schematic cross-section through an alternative embodiment of the semiconductor device 2 illustrated in FIG. 2. Components with functions identical to those illustrated in FIG. 2 are indicated by using the same reference numerals and not described in greater detail. In this alternative embodiment illustrated in FIG. 3, the field plate 15 is connected to a gate bond contact area 13 a certain distance from the edge termination. The field plate 15 is also connected to the gate electrodes 10 in the cell field. This figure illustrates the usual position 15 of a gate bond contact area. In this position traditional conductive areas in the edge termination are covered with insulators to prevent electrical arc-over and leakage currents, and are not therefore accessible for connection to a bonding wire. The $n^+$-doped zone 21 indicated in FIG. 3 is optional and further promotes an increase in the reverse transfer capacitance $C_{GD}$ of the semiconductor device.

Figure 4:
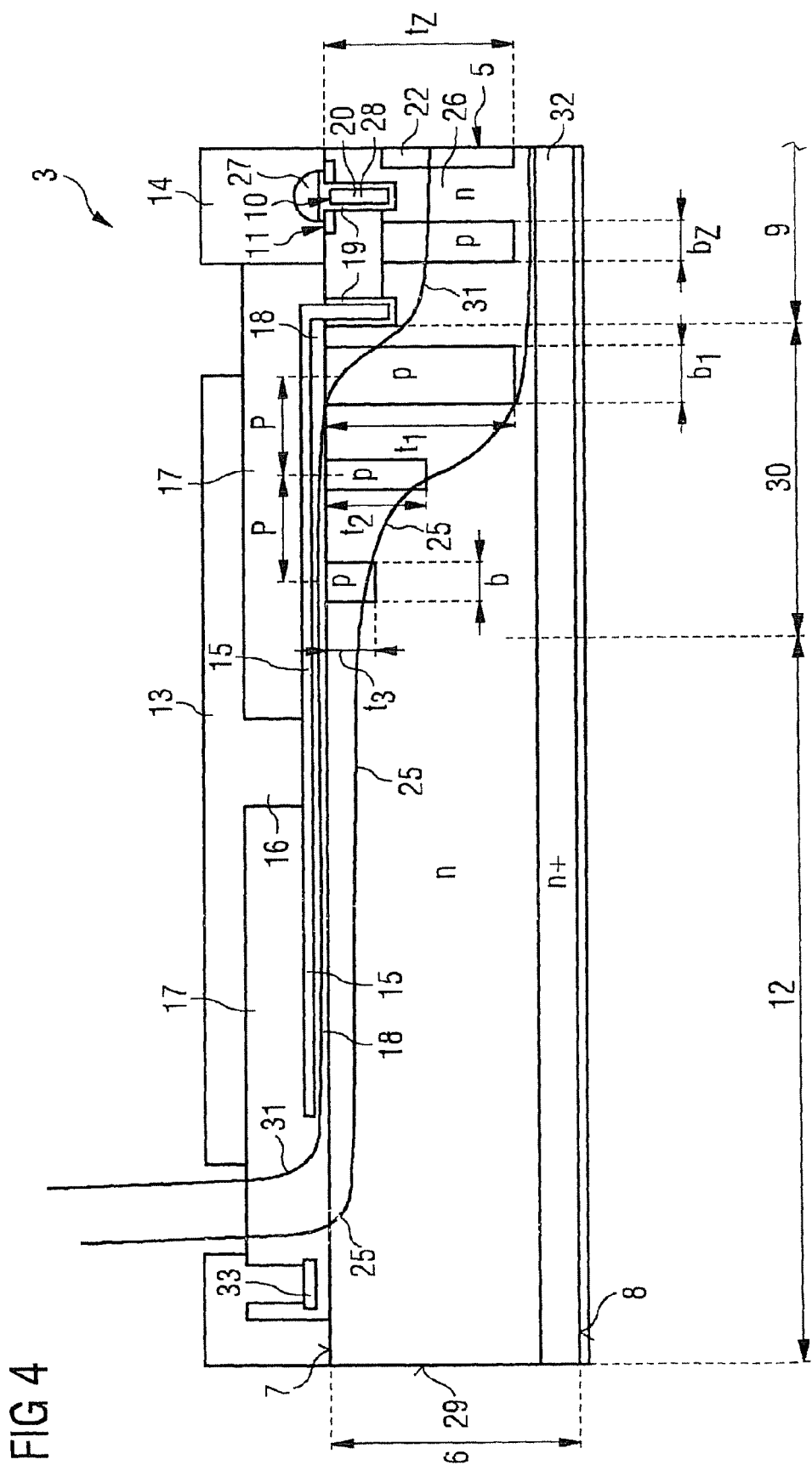
FIG. 4 illustrates a schematic cross-section through a semiconductor device as disclosed in a further embodiment.

FIG. 4 illustrates a schematic cross-section through a semiconductor device 3 as disclosed in a further embodiment. Components with functions identical to those illustrated in the preceding figures are indicated by using the same reference numerals and are not described in greater detail here. The structure of the semiconductor device 3 illustrated in FIG. 4 corresponds to that previously illustrated in FIG. 1, although in order to achieve a smooth transition region of the equipotential lines 25 and 31 from the cell field 9 to the edge region 12 the charge compensation zones 22 are configured such that they are positioned at almost constant stepwidth P as in the central cell field 9, and the width b is kept as in the cell field, but the depth $t_z$ of the charge compensation zones with body zone in the cell region 9 is reduced from $t_1$ via $t_2$ to $t_3$. This has a similar effect on the equipotential lines as the reduction of the width b of the charge compensation zones 22 at constant depth t.

Figure 5:
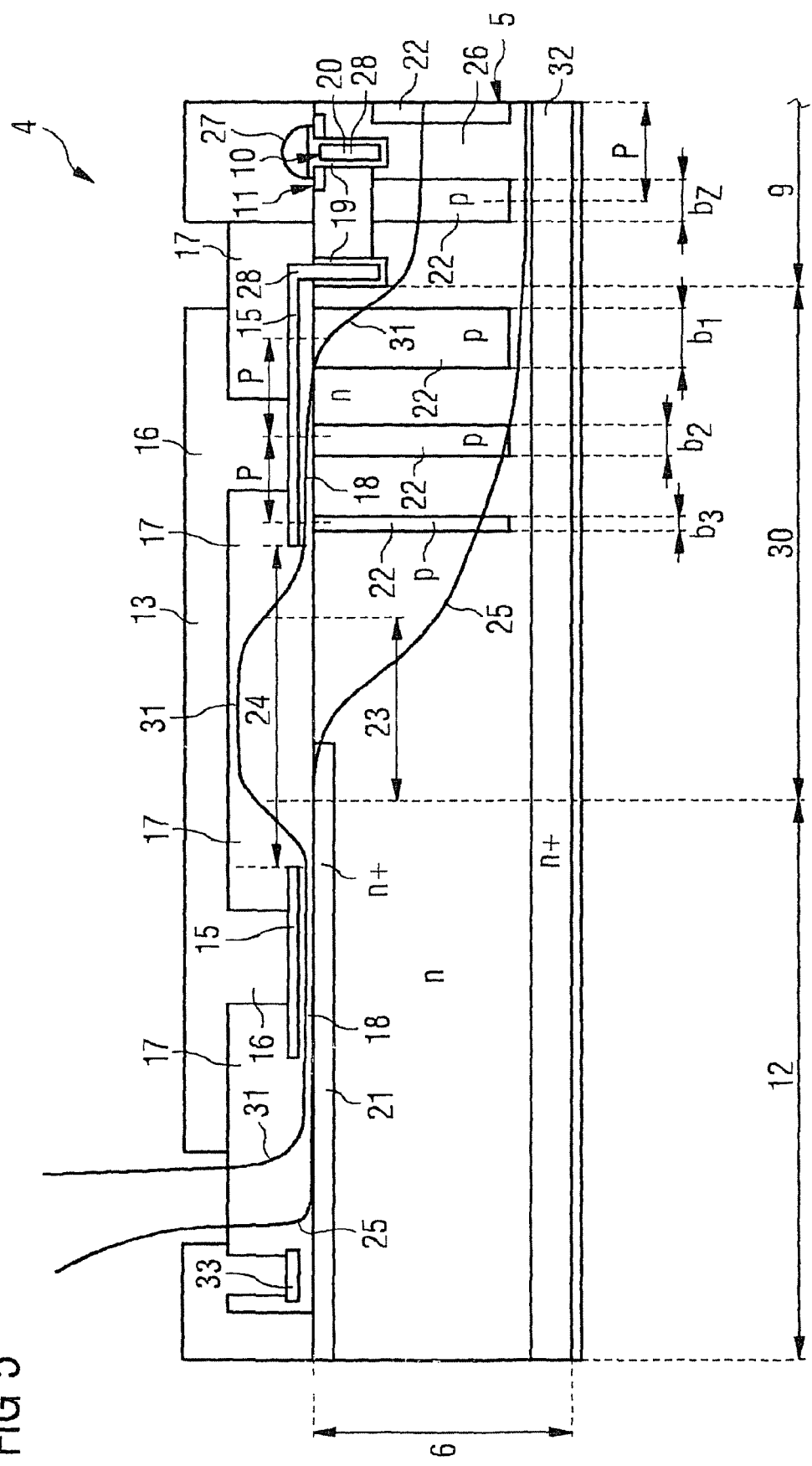
FIG. 5 illustrates a schematic cross-section through a semiconductor device as disclosed in a further embodiment.

FIG. 5 illustrates a schematic cross-section through a semiconductor device 4 as disclosed in a further embodiment. In this semiconductor device 4 a voltage-receiving zone 23 in the transition region 30 between the cell field 9 and the edge region 12 is provided with increased oxide thickness at the transition 30 from the cell field 9 to the edge region 12 by giving the field plate 15 a recess 24. This prevents a sharp curve in the equipotential surface 31, as illustrated in FIG. 2 at the transition from the n-conducting edge zone to the $n^+$-conducting highly doped zone 21, thereby reducing voltage spikes. In this arrangement, the field plate regions are electrically connected to the gate bond contact area 13 before and after the recess 24. Thanks to this voltage-reducing region 23 it is possible to achieve a relatively thin field plate oxide 18, the $n^+$-conducting, highly doped zone 21 in the edge region simultaneously ensuring that the equipotential line 25 is shifted out of the semiconductor body 6 to the field plate oxide 18 near the surface.

Thus the high field strengths occurring inside the semiconductor to the right and left of the $n^+$-conducting zone 21 forming the drain-side electrode of the capacitor are reduced. As a result the blockability of the semiconductor device 4, which might otherwise be reduced at these points by the voltage-receiving region 23 consisting of the semiconductor over a transition region 30 which also has a thick intermediate insulating layer, is completely removed from the low doped semiconductor region. Only outside this transition region does the voltage then fall due to a thin dielectric layer made of field plate oxide 18. The left-hand region of the field plate structure 15 bonded by the contact via 16 in FIG. 5 is illustrated with a relatively small surface area. In one embodiment, it may cover a large area of the edge region 12.

In this arrangement, the $n^+$-conducting zone 21 stops the electrical field from penetrating the semiconductor body 6 in this zone 21, thereby preventing any collision ionisation which might reduce blockability. This embodiment as illustrated in FIG. 5 achieves an improved transition 30 from the cell field 9 to a highly doped $n^+$-conducting zone 21 near the surface of the semiconductor body 6. The masks for the field plate structure 15 in the edge region 12 of the semiconductor device 4 must therefore be adapted accordingly.

Instead of the variation in the widths of the charge compensation zones illustrated in FIG. 5 which ensure smoother radii of curvature of the equipotential lines in the transition region 30, it is also possible to combine charge compensation zones with variable penetration depth as illustrated in FIG. 4, and with a voltage-receiving region 23.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device with a charge carrier compensation structure in a semiconductor body comprising:
a central cell field with a near-surface gate—and source structure;
an edge region lying adjacent to the cell field;
bond contact areas in the edge region which are electrically connected to the gate structure or to the source structure;
there being positioned under at least one part of at least one of the bond contact areas a laterally extending, capacitance-increasing field plate which is insulated from the semiconductor body and electrically connected to at least one of the near-surface bond contact areas; and
wherein the cell field includes a transition region adjacent to the edge region having a plurality of charge compensation zones that decrease in width towards the edge region such that first, second and third consecutive charge compensation zones have respective first, second and third decreasing widths.

2. The semiconductor device of claim 1, wherein the capacitance increasing field plate is positioned beneath the gate bond contact area and set to gate potential by contact vias through an intermediate oxide.

3. The semiconductor device of claim 1, wherein the capacitance increasing field plate is positioned beneath the source bond contact area and set to source potential by contact vias through an intermediate oxide.

4. The semiconductor device of claim 1, wherein the capacitance increasing field plate is electrically coupled to near-edge planar or trench gate electrodes of the cell field and to the gate bond contact area.

5. The semiconductor device of claim 1, wherein there is positioned between the upper side of the semiconductor body and the capacitance-increasing field plate a field plate oxide of a thickness greater than the thickness of a gate oxide.

6. The semiconductor device of claim 1, wherein sharp radii of curvature of the equipotential lines/equipotential surfaces in the transition region from the cell field to the edge region are avoided by the decreasing widths of the charge compensation zones varying the compensation in the transition region.

7. The semiconductor device of claim 1, wherein there is a variable degree of compensation, in the difference between the p- and n-dopant dosages, between an almost fully compensated state in the cell field to a reduction in the p-dopant dosages towards the edge region.

8. The semiconductor device of claim 1, wherein the semiconductor body in the edge region opposite the capacitance-increasing field plate includes a highly doped, $n^+$-conducting zone.

9. The semiconductor device of claim 1, wherein the charge compensation zones decrease in width towards the edge region at constant stepwidth.

10. The semiconductor device of claim 1, wherein the cell field towards the edge region includes charge compensation zones which decrease in depth towards the edge region at constant stepwidth.

11. The semiconductor device of claim 1, wherein the semiconductor body includes a voltage-receiving zone at the transition from the cell field to the edge region in which the field plate has a recess which reduces voltage spikes, thereby avoiding sharp curves in equipotential surfaces, the field plate regions before and after the recess being electrically connected to the gate bond contact area.

* * * * *